United States Patent [19]

Simoudis

[11] Patent Number: 5,218,557
[45] Date of Patent: * Jun. 8, 1993

[54] EXPERT SYSTEM FOR ASSISTING IN THE DESIGN OF A COMPLEX SYSTEM

[75] Inventor: Evangelos Simoudis, Marlboro, Mass.

[73] Assignee: Digital Equipment Corporation, Maynard, Mass.

[*] Notice: The portion of the term of this patent subsequent to May 14, 2008 has been disclaimed.

[21] Appl. No.: 779,164

[22] Filed: Oct. 21, 1991

Related U.S. Application Data

[63] Continuation of Ser. No. 560,030, Jul. 26, 1990, abandoned, which is a continuation of Ser. No. 463,905, Jan. 10, 1990, abandoned, which is a continuation of Ser. No. 106,840, Oct. 8, 1987, abandoned.

[51] Int. Cl.⁵ ............................................. G06F 15/18
[52] U.S. Cl. .................................... 364/578; 395/500
[58] Field of Search ............... 364/518, 521, 522, 578, 364/150, 513; 395/500, 75, 77, 919, 920

[56] References Cited

U.S. PATENT DOCUMENTS

| | | | |
|---|---|---|---|
| 4,648,044 | 3/1987 | Hardy et al. | 364/513 |
| 4,658,370 | 4/1987 | Erman et al. | 364/513 |
| 4,716,542 | 12/1987 | Peltz et al. | 364/518 |
| 4,722,064 | 1/1988 | Suzuki | 364/518 |
| 4,727,496 | 2/1988 | Ryouki | 364/518 |
| 4,736,306 | 4/1988 | Christensen et al. | 364/513 |
| 4,740,886 | 4/1988 | Tanifuji et al. | 364/150 |
| 4,747,042 | 5/1988 | Ishii et al. | 364/518 |
| 4,757,461 | 7/1988 | Stöhr et al. | 364/518 |
| 4,773,028 | 9/1988 | Tallman | 364/578 |
| 4,835,709 | 5/1989 | Tsai | 364/513 |
| 4,837,735 | 6/1989 | Allen, Jr. et al. | 364/513 |
| 4,847,784 | 7/1989 | Clancey | 364/513 |
| 4,860,204 | 8/1989 | Gendron et al. | 364/513 |
| 4,866,635 | 9/1989 | Kahn et al. | 364/513 |
| 4,868,763 | 9/1989 | Masui et al. | 364/513 |
| 5,016,204 | 5/1991 | Simoudis et al. | 364/578 |

OTHER PUBLICATIONS

Bond et al., Integrating Prolog and CADAM to Produce an Intelligent CAD System, Westex 1987 IEEE Proceedings Conference on Expert Systems, pp. 152–160.

Jiaoying et al., Artificial Intelligence in Computer Aided Design 1987 Elsevier Science Publishers, Computers in Industry, pp. 277–282.

Sanjay Mittal, Olive L. Dym. Mahesh Marjaria; PRIDE: An Expert System for the Design of Paper Handling Systems; 1986; pp. 102–114.

Louis I. Steinberg, Tom M. Mitchell; A Knowledge Based Approach to VLSI CAD The Redesign System; 1984; pp. 412–418.

David C. Brown, B. Chandrasekaran; Knowledge and Control for a Mechanical Design Expert System; 1986; pp. 92–100.

H. Penny Nii; Blackboard Systems: The Blackboard Model of Problem Solving and the Evolution of Blackboard Architectures; Summer, 1986; pp. 38–53.

H. Penny Nii; Blackboard Systems Blackboard Application Systems, Blackboard Systems from a Knowledge Engineering Perspective; Aug., 1986; pp. 82–106.

John R. Dixon; Artificial Intelligence and Design: A Mechanical Engineering View; pp. 872–877.

John R. Dixon, Eugene C. Libardi, Jr., Steven C. Luby, Mohan Vaghul, Melvin K. Simmons; Expert Systems for Mechanical Design: Examples of Symbolic Representations of Design Geometries*; 1987; pp. 1–10.

Andrew Gelsey; Automated Reasoning about Machine Geometry and Kinematics; 1987; pp. 182–187.

Primary Examiner—Parshotam S. Lall
Assistant Examiner—Collin W. Park
Attorney, Agent, or Firm—Barry N. Young; Ronald E. Myrick

6 Claims, 4 Drawing Sheets

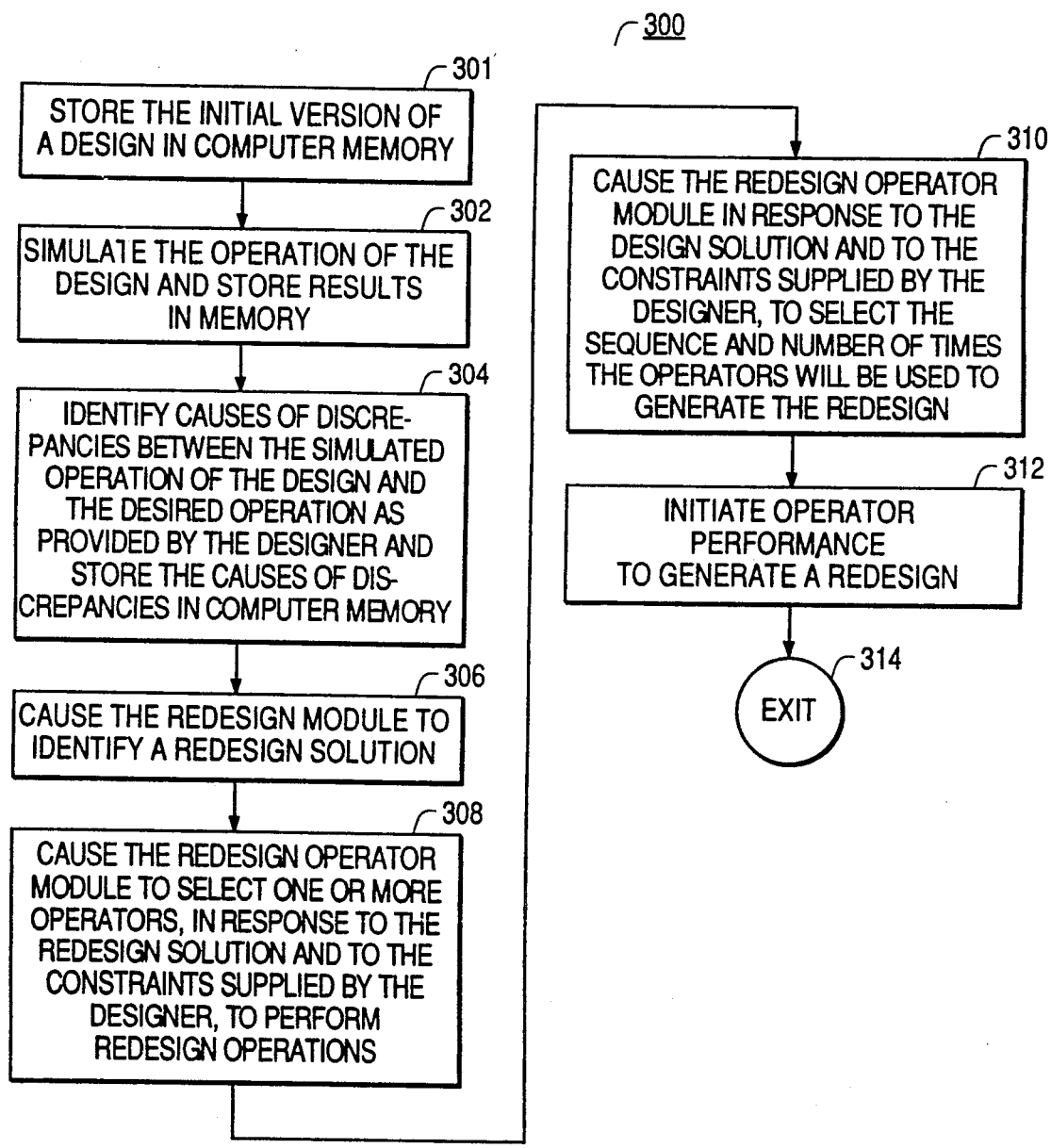

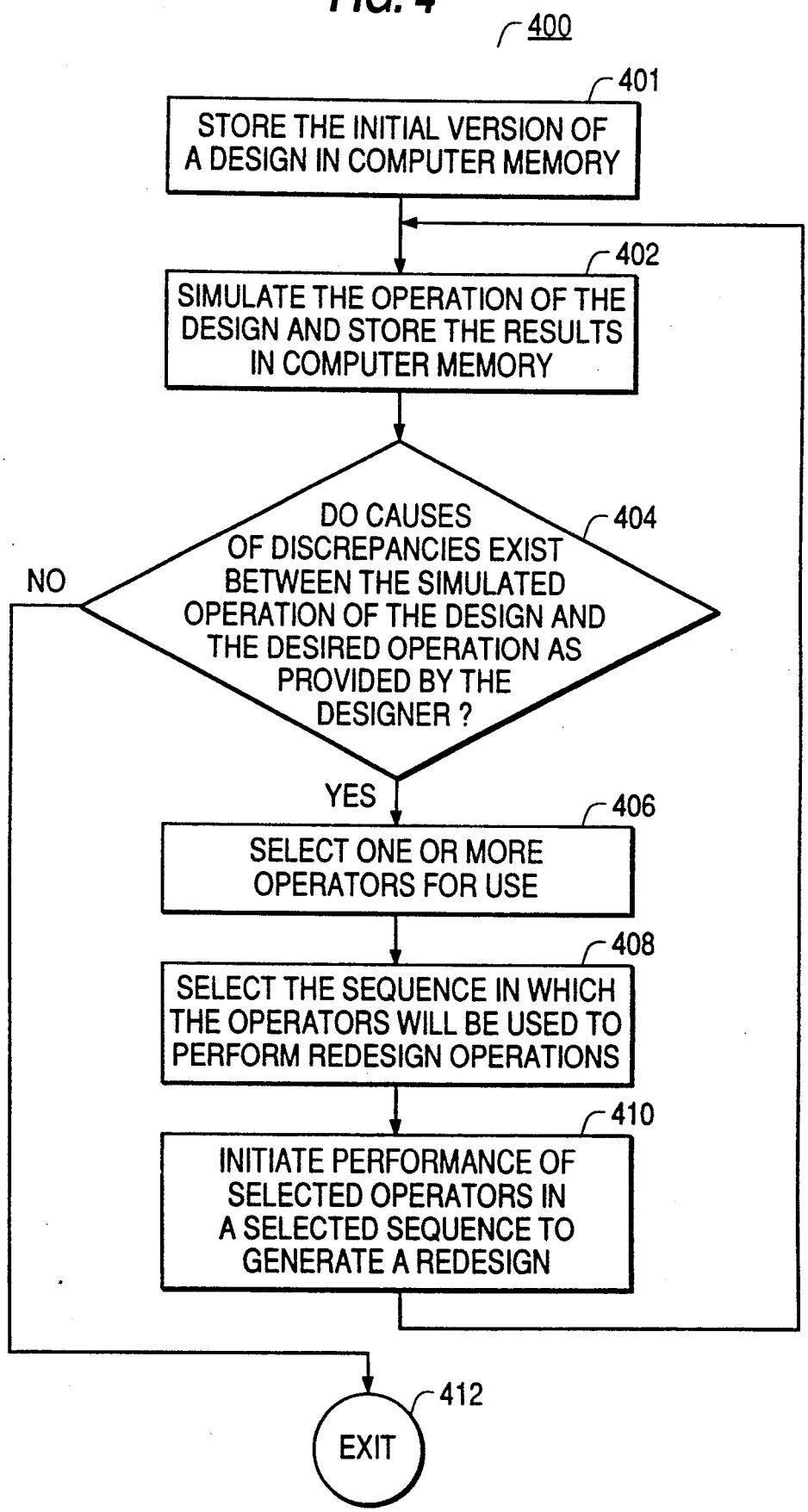

EXPERT SYSTEM FOR ASSISTING IN THE DESIGN OF A COMPLEX SYSTEM

This application is a continuation of application Ser. No. 07/560,030 filed Jul. 26, 1990 which was a continuation of Ser. No. 07/463,905 filed Jan. 10, 1990 which was a continuation of Ser. No. 07/106,840 filed Oct. 8, 1987 which are all now abandoned.

BACKGROUND OF THE INVENTION

1. Field of the Invention

The invention relates generally to expert systems, and more specifically to the field of systems for automatically analyzing, diagnosing and redesigning of complex systems, such as digital circuit networks.

2. Description of the Prior Art

Recently, expert systems have been developed in several fields, most notably medicine, in which such systems are used for diagnostic purposes. Broadly speaking, an expert system essentially includes a data base of premises and conclusions, and the expert system, in response to input information, searches the data base to attempt to find the conclusions whose premises match, to within a selected degree, the input information. Some expert systems, such as those for medical diagnoses, allow a conclusion to be reached iteratively, reaching preliminary conclusions and suggestions for obtaining further input facts which tend to increase the probability that some conclusions are correct, and concomitantly decrease the probability that others are correct.

More specifically, in some expert systems, the system, based on initial input information from an operator and the contents of the data base, selects one or more preliminary conclusions which it deems likely. In addition, upon selecting the preliminary conclusions, the expert system suggests tests which may provide additional data, which, after being obtained, is input to the expert system. Based on the additional data, the probability that one or more of the original conclusions is correct may be enhanced, and the probability of correctness of the others decreased, thereby narrowing the set of likely conclusions. The sequence is repeated iteratively to further narrow the set of likely conclusions until, preferably, one conclusion is reached which is the most likely conclusion based on all of the input data.

Expert systems techniques have been used in connection with system design tools used in the design of complex systems, such as digital electronic circuits, which are used in determining where problems arise in the design of the complex system and suggesting corrections. Such systems basically include three general components, namely, a simulation component, a diagnosis component and a redesign component. The simulation component receives the initial representation of the design of the complex system from the designer and performs a simulation operation to determine the operation of the complex system in response to inputs provided by the designer. The diagnosis component receives (a) from the simulation component the result of the simulation and (b) from the designer a description of the desired operation. Based on that information, the diagnosis component identifies discrepancies between the simulated operation and the desired operation and the causes of the discrepancies.

The redesign component receives the design representation provided by the operator and the causes of the discrepancies, as identified by the diagnosis component, between the simulated operation and the desired operation, and determines, using expert system techniques, ways of redesigning the complex system so as to eliminate the discrepancies. In this, the redesign component may also receive user constraints on the complex system being designed, which may enter into the selection of appropriate redesigns. To verify the redesign as generated by the redesign component, the redesign component may then transmit the redesigned complex system to the simulation component for simulation. Thus, an iterative process, involving iterative operation of the simulation component, the diagnosis component and the redesign component, may be required to provide a final design for the complex system.

Essentially, the expert system used in the redesign component provides, for each discrepancy which can be identified by the diagnosis component, a set of operators which operates on the components of the complex system to provide a modified design which is then simulated and diagnosed. In existing redesign components, as illustrated in D. Brown, et al., "Knowledge And Control For A Mechanical Design Expert System", I.E.E.E. Computer, Vol. 19, No. 7 (July, 1986), pp. 92–100, which are used in design tools, the expert systems are constrained so that the operators are all applied in predetermined sequences. Thus, in those systems, the redesign components can only operate in connection with fairly routine redesigns, thus limiting their utility.

SUMMARY OF THE INVENTION

The invention provides a new and improved system design tool, and specifically a new redesign component, including an improved expert system, for use in a system design tool to perform redesign operations in connection with a design representation which is useful in connection with a redesign.

In brief summary, the new system design tool receives a design representation from a designer, simulates it and compares the simulated operation of the design representation with the desired operation as provided by the operator and identifies causes of discrepancies therebetween. The redesign component performs redesign operations on the design representation in response to the discrepancies. The redesign component includes a plurality of redesign modules each including a redesign solution selection module which receives the identification of causes of discrepancies and the design representation and identifies a redesign solution in response thereto. Each redesign module, in turn, includes at least one redesign operator module which includes a plurality of redesign operators controlled by a redesign control module. The redesign operators each perform a redesign operation in connection with the design representation. The redesign control module, in turn, receives the redesign solution from the redesign solution selection module and sequentially enables selected redesign operators to carry out the redesign solution.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 3 is a flow chart detailing one iteration of a redesign process of the invention; and FIG. 4 is a flow chart detailing an iteratively repeating design process of the invention.

DETAILED DESCRIPTION OF AN ILLUSTRATIVE EMBODIMENT

Figure 1:
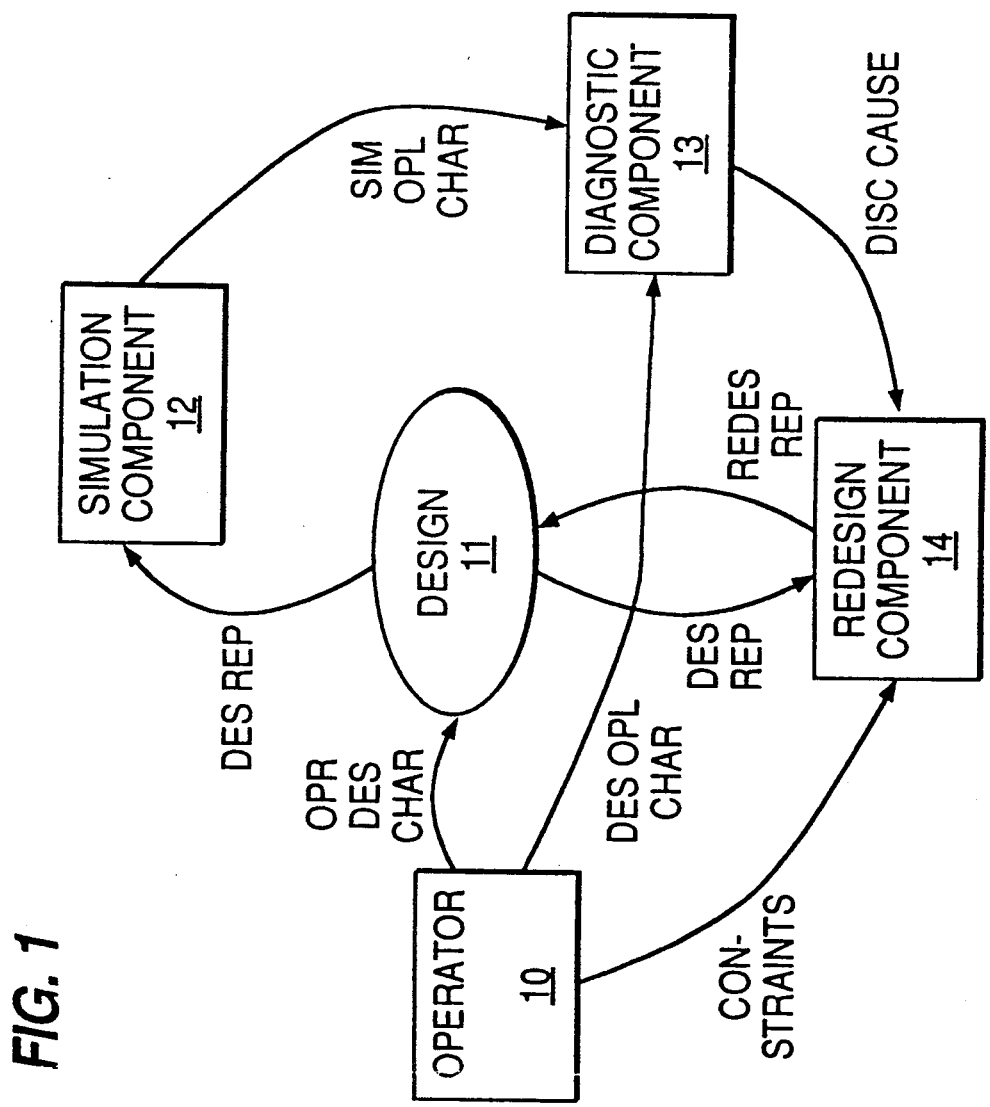
FIG. 1 is a general block diagram of a system design tool including the invention.

FIG. 1 depicts a general block diagram of a system design tool which includes the invention. With reference to FIG. 1, the system design tool receives from an operator 10, which may be the designer of the complex system for whose design the system design tool will be used, OPR DES CHAR operator input design characteristics, from which a design representation 11 (step 302) is generated (step 301 and step 401). After the operator has finished providing the design representation 11, it is coupled, as DES REP design representation, to a simulation component 12. The simulation component 12 performs a simulation of the design of the complex system as represented by the design representation 11 (step 303 and step 402). The simulation component 12 provides SIM OPL CHAR simulated operational characteristics which illustrate the operation of the complex system as represented by the design representation 11.

The SIM OPL CHAR simulated operational characteristics provided by the simulation component 12 are coupled to a diagnostic component 13. The diagnostic component 13 also receives from the operator 10 DES OPL CHAR desired operational characteristics which describe the desired operation of the complex system represented by design representation 11. The diagnostic component 13 identifies discrepancies between the SIM OPL CHAR simulated operational characteristics and the DES OPL CHAR desired operational characteristics and also determines in response thereto DISC CAUSE discrepancy causes which identify causes of the discrepancies (step 304 and 404).

The DISC CAUSE discrepancy causes identified by the diagnostic component 13 are coupled to a redesign component 14. The redesign component also receives a set of CONSTRAINTS from the operator 10 and the DES REP design representation from the design representation 11. In response to all of these inputs, the redesign component 14 generates REDES REP redesigned design representation, which represents a design representation as modified to rectify the operational discrepancies represented by the DISC CAUSE discrepancy causes identified by the diagnostic component 13.

The REDES REP redesigned design representation generated by the redesign component forms a new design representation 11. The new design representation 11 is coupled as the DES REP design representation to the simulation component 12, which again performs a simulation on the redesigned design representation. The procedure described above is repeated to enable the diagnostic component 13 to identify new DISC CAUSE discrepancy causes and redesign component 14 to generate a new REDES REP redesigned design representation. The process is iteratively repeated until the diagnostic component 13 determines that the SIM OPL CHAR simulated operational characteristics correspond to the DES OPL CHAR design operational characteristics provided by the operator. At that point, the design of the complex system, as represented by the design representation 11, corresponds to the design required to provide the DES OPL CHAR design operational characteristics.

Figure 2:
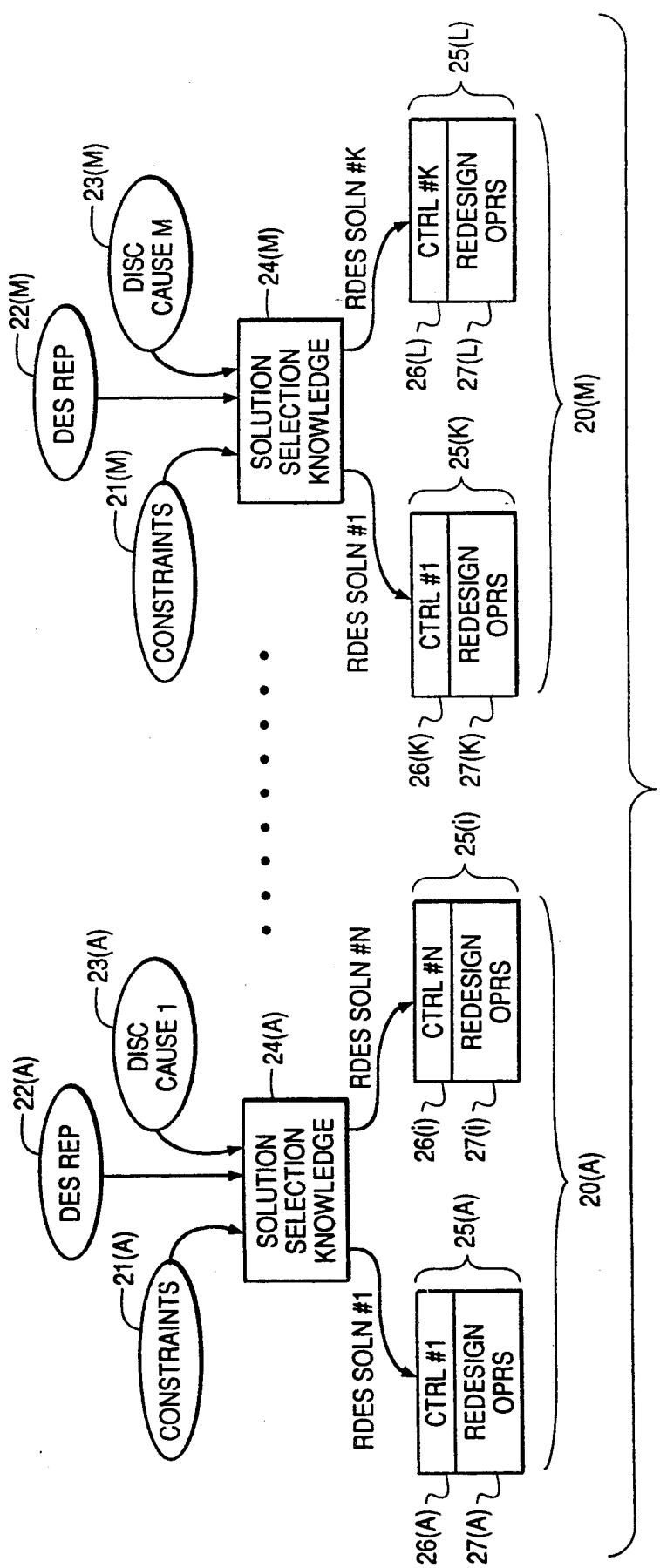
FIG. 2 is a detailed block diagram of an expert system useful in the redesign components of the system design tool depicted in FIG. 1.

The simulation component 12 and diagnostic component 13 in the system design tool are conventional components, and are generally described in the aforementioned article, D. Brown, et al., "Knowledge And Control For A Mechanical Design Expert System". FIG. 2 depicts the details of the redesign component 14. With reference to FIG. 2, the redesign component 14 includes a plurality of redesign modules 20A through 20(M) (generally identified by reference numeral 20). The redesign modules 20 effectively perform different types of redesign operations on the design representation 11 in response to diverse types of discrepancy causes which the diagnostic component 13 can identify.

Each redesign module 20 includes a CONSTRAINTS input 21(A) through 21(M) (generally identified by reference numeral 21) from the operator 10, a DES REP design representation input 22(A) through 22(M) (generally identified by reference numeral 22) from design representation 11, and a DISC CAUSE X ("X" is a variable value representing a discrepancy type) discrepancy cause input 23(A) through 23(M) (generally identified by reference numeral 23) from the diagnostic component 13. The DISC CAUSE discrepancy cause inputs 23(A) through 23(M) represent diverse types of discrepancy causes which the diagnostic component 13 can identify. The CONSTRAINTS inputs 21 and DES REP design representation inputs 22 to the redesign modules 20 may all be the same or they may comprise only the portions of the inputs 21 and 22 which relate to the DISC CAUSE X discrepancy cause inputs received by the respective redesign modules.

In each redesign module 20, the CONSTRAINTS input 21, DES REP design representation input 22 and the DISC CAUSE X discrepancy cause input 23 are all received by a solution selection knowledge module 24(A) through 24(M) (generally identified by reference numeral 24). In response to the values of the inputs, the solution selection knowledge module 24 identifies one more redesign solutions RDES SOLN #X ("X" is an integer) (step 306). Each redesign solution indicates the redesign operations to be performed to provide a modification of the design representation 11 represented by DES REP design representation inputs 22 which would eliminate the discrepancies identified by diagnostic component 13 and identified by the DISC CAUSE X discrepancy causes input to the solution selection knowledge 24.

Each RDES SOLN #X redesign solution selected by the solution selection knowledge 24 enables a redesign operator module generally identified by reference numeral 25. Each redesign operator module 25 includes a redesign control portion, generally identified by reference numeral 26, which controls one or more redesign operators generally identified by reference numeral 27. In response to an appropriate RDES SOLN #X redesign solution from the solution selection knowledge module 24, the redesign control portion 26 of the redesign operator module 25 enables one or more of the redesign operators 27 in the redesign operator module 25 (step 308 and step 406). The result is a modification of the design representation represented by the DES REP design representation input 22 to the solution selection knowledge module 24 in the redesign module 20 (step 312 and step 410).

The redesign control portion 26 in each redesign operator module 25 determines, from the RDES SOLN #X redesign solution from the solution selection knowledge module 24, the order and number of times that the redesign operators 27 are to be applied to produce the redesigned design representation which is represented by the REDES REP redesign representation coupled to design representation 11 (step 310 and step 408). Depending on the design representation 11, represented by the DES REP design representation input 22, and the DISC CAUSE X discrepancy cause input 23 from the diagnostic component 13, the redesign control portion 26 may apply a particular operator in its redesign operators 27 one time, several times, or not at all.

A specific example would be helpful in understanding the operation of the redesign component 14. One embodiment of the design tool system depicted in FIG. 1 constitutes a system for assisting in the design of a digital electronic circuit network. If, for example, the operator is designing a bus circuit, which may include drivers, receivers, bus lines, terminators, and so forth, on a printed circuit board, the design representation 11 may include a detailed representation of the lay out of the circuit on the printed circuit board, including identification of the components to be used, their locations on the printed circuit board, the locations of the circuit traces, information concerning mounting of the components on the printed circuit board, and so forth. The simulation component 12 simulates the circuit represented by the design representation, and the diagnostic component 13 compares the SIM OPL CHAR simulated operational characteristics from the simulation component to the DES OPL CHAR desired operational characteristics from the operator 10.

If, for example, the diagnostic component 13 determines that a discrepancy exists between the simulated propagation delay of a signal on the bus represented by design representation 11 and the desired propagation delay as provided by the operator 10, the diagnostic component 13 identifies that as a DISC CAUSE. In response, a solution selection knowledge module 24 (FIG. 2) determines that a redesign solution is the removal of one or more receivers from the circuit, and generates the appropriate RDES SOLN #X to a redesign operator module 25 to enable that to occur. The redesign control portion 26 of the redesign operator module applies the operators to the design representation as provided by the DES REP design representation input to solution selection knowledge module 24 to generate the REDES REP redesign design representation which is provided to the design representation 11.

More specifically, if the diagnostic component 13 determines that two receivers are two receivers violate propagation delay characteristics determined by the DES OPL CHAR desired operational characteristics provided by the operator 10, the particular solution selection knowledge module 24 then initially generates a RDES SOLN #X redesign solution which enables a redesign operator module to perform a redesign of the circuit such that those two receivers are removed from the circuit.

To perform the redesign for each receiver to be removed, the redesign control portion 26 enables application of various redesign operators 27, including: (1) removal of receiver, (2) removal of circuit board trace to receiver, (3) removal of circuit mounting, and (4) connection of bus terminator. The redesign control portion 26 determines the order of application of the operators 27, and so in removing multiple receivers, it may interleave the application of operators 27 so that the bus terminator is connected only once, namely, after the circuit board trace relating to both receivers is removed.

The new system design tool provides a number of advantages. By providing a number of diverse redesign operators 27 which are selectively enabled under control of redesign control portions 26, the control of the redesign is dynamic, that is, it can depend on the particular discrepancy or discrepancies identified by the diagnostic component.

In addition, the system does not require multiple sets of redesign operators each for performing closely related redesign operations. In prior systems, as exemplified by the system described in the aforementioned Brown article, one sequence of redesign operators would be needed to enable a redesign in which one receiver is removed from a design representation, another sequence would be needed to enable a redesign in which two receivers are removed, and so forth, even though many of the same redesign operators would be the same in the two sequences. This redundancy is eliminated by providing the redesign control 26 which selectively enables the redesign operators 27 as necessary to provide the solution identified by the solution selection knowledge module 24.

Furthermore, by separating the redesign operators 27 and having them individually applied by the redesign control 26, the designer may be able to interact with the redesign control 26 to, for example, select the number of times an operator may be applied. For example, if the solution identified by the solution selection knowledge module 24 to a discrepancy is to remove two receivers, the designer may limit the redesign to removal of only one receiver during a design iteration. When the redesigned design representation is simulated by simulation component 12, the designer can determine the effect on circuit operation of having only one receiver removed. Similarly, since each redesign operator 27 is responsible for performing only one modification to the design representation, the designer can understand the steps contained by each solution identified by the solution selection knowledge module 24.

Finally, by providing independently applicable redesign operators 27 controlled by the redesign control 26, the redesign component 14 can be easily expanded. Essentially, the various solutions enabled by the solution selection knowledge module 24 exist as independent entities, namely, the redesign operation modules 25, in each redesign module 20. Thus, the number of redesign operation modules 25 can be varied to add new redesign operators 27 and their associated redesign control 26 without worrying about the possible side effects on the existing redesign operation modules 25.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A method for modifying a design of a complex system, the steps of the method performed by a data processing expert system having a memory, comprising:

storing in said memory input design characteristics data provided by a designer of said complex system that represents an initial version of said design of said complex system;

processing said input design characteristics data to simulate the operation of said design thereby producing a plurality of simulated operational characteristics data of said design, said plurality of simulated operational characteristics data stored in the memory;

comparing the simulated operational characteristics of the design with a plurality of desired operational characteristics stored in the memory as provided by the designer of said complex system and identifying causes of discrepancies between said simulated operational characteristics of said design and said desired operational characteristics as provided by said designer;

storing a set of operators, in said memory for performing redesign operations on a plurality of components of the complex system, to generate a redesign of said complex system; and redesigning said complex system by causing said operators to perform said redesign operations in a selected sequence on said plurality of components.

2. The method of claim 1 further comprising the steps of:

storing a plurality of redesign modules each of which is associated with a category of redesign operations and each of which contains a redesign solution selection module;

identifying a redesign solution using said redesign solution selection module, which indicates the redesign operations to be performed by said operators for said redesign of said complex system, based on said design and said causes of discrepancies.

3. The method of claim 2 further comprising the steps of:

storing a plurality of redesign operator modules in each redesign module;

storing a plurality of operators from said set of operators in each redesign operator module;

selecting one or more of said plurality of operators for use in performing redesign operations to generate said redesign in response to said redesign solution.

4. The method of claim 3 further comprising selecting the sequence and number of times that said selected operators will be used to generate said redesign in response to said redesign solution.

5. The method of claim 4 further comprising the steps of:

responding to constraints supplied by said designer by selecting one or more of said operators for use and selecting the sequence in which said operators perform said redesign operations; and redesigning said complex system by causing said selected operators to perform redesign operations in said selected sequence in response to said redesign solution and said constraints.

6. The method of claim 1, further comprising:

the step of iteratively performing the steps of:

processing said input design characteristics data to simulate the operation of said design, thereby producing a plurality of simulated operational characteristics data of said design;

comparing the simulated operational characteristics data with desired operational characteristics data provided by the designer and identifying causes of discrepancies therebetween;

selecting one or more operators for use in said redesign operations; and selecting the sequence in which said operators will be used to perform said redesign operations in response to said design and said causes of discrepancies; and redesigning said complex system by causing said selected operators to perform said redesign operations in said sequence to generate said redesign of said complex system.

* * * * *